(12) United States Patent
Roy

(10) Patent No.: US 9,917,125 B2
(45) Date of Patent: Mar. 13, 2018

(54) LOW REFLECTANCE BACK-SIDE IMAGER

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/959,687

(22) Filed: Dec. 4, 2015

(65) Prior Publication Data

US 2016/0351611 A1    Dec. 1, 2016

(30) Foreign Application Priority Data

Jun. 1, 2015   (FR) ..................... 15 54966

(51) Int. Cl.
  *H01L 27/146*   (2006.01)
(52) U.S. Cl.
  CPC .... *H01L 27/14636* (2013.01); *H01L 27/1462* (2013.01); *H01L 27/1464* (2013.01); *H01L 27/14685* (2013.01)

(58) Field of Classification Search
  CPC ............. H01L 27/146; H01L 27/14636; H01L 27/0512
  See application file for complete search history.

(56) References Cited

U.S. PATENT DOCUMENTS

| | | |
|---|---|---|
| 8,791,512 B2 | 7/2014 | Roy et al. |
| 2009/0160983 A1* | 6/2009 | Lenchenkov ..... H01L 27/14632 348/294 |
| 2009/0200631 A1 | 8/2009 | Tai et al. |
| 2013/0113968 A1 | 5/2013 | Lenchenkov et al. |

OTHER PUBLICATIONS

INPI Search Report and Written Opinion for FR 1554966 dated Jan. 5, 2016 (7 pages).

* cited by examiner

*Primary Examiner* — Asok Kumar Sarkar
*Assistant Examiner* — Grant Withers
(74) *Attorney, Agent, or Firm* — Gardere Wynne Sewell LLP

(57) ABSTRACT

A back-side imager includes a matrix of photosites in an active layer. An interconnect layer covers the active layer. A layer of germanium is positioned between the active layer and the interconnect layer.

9 Claims, 1 Drawing Sheet

LOW REFLECTANCE BACK-SIDE IMAGER

PRIORITY CLAIM

This application claims priority from French Application for Patent No. 1554966 filed Jun. 1, 2015, the disclosure of which is incorporated by reference.

TECHNICAL FIELD

The invention relates to CMOS technology imagers, notably the imagers of "back-side" imaging type.

BACKGROUND

An imager in CMOS technology comprises a matrix of photosensitive pixels produced in an active layer, generally of weakly boron-doped silicon. The interconnections used to control the pixels are produced above the active layer by conductive tracks on a number of metal levels. With the matrices of pixels having an increasingly smaller pitch, the interconnect network, which is opaque, increasingly masks the light reaching the photosites of the pixels in a conventional "front-side" imager.

A "back-side" imager is designed for the light to reach the photosites through the face opposite the interconnect network, such that the interconnect network no longer contributes to reducing the quantity of light reaching the photosites.

This imager structure can however present drawbacks in certain applications.

SUMMARY

Generally, a back-side imager is provided comprising a matrix of photosites in an active layer; an interconnect layer covering the active layer; and a layer of germanium between the active layer and the interconnect layer.

The layer of germanium can have a thickness of between 0.2 and 1 µm, preferably approximately 0.6 µm.

The imager can comprise a layer of semiconductive oxide between the active layer and the layer of germanium.

The layer of germanium can be biased to a reference potential.

The imager can comprise trench isolators delimiting the photosites, the trenches including a capacitive memory for each photosite, accessible via the interconnect layer.

BRIEF DESCRIPTION OF THE DRAWINGS

Embodiments will be explained in the following description, given as a non-limiting example in relation to the attached figures in which.

DETAILED DESCRIPTION

Figure 1:
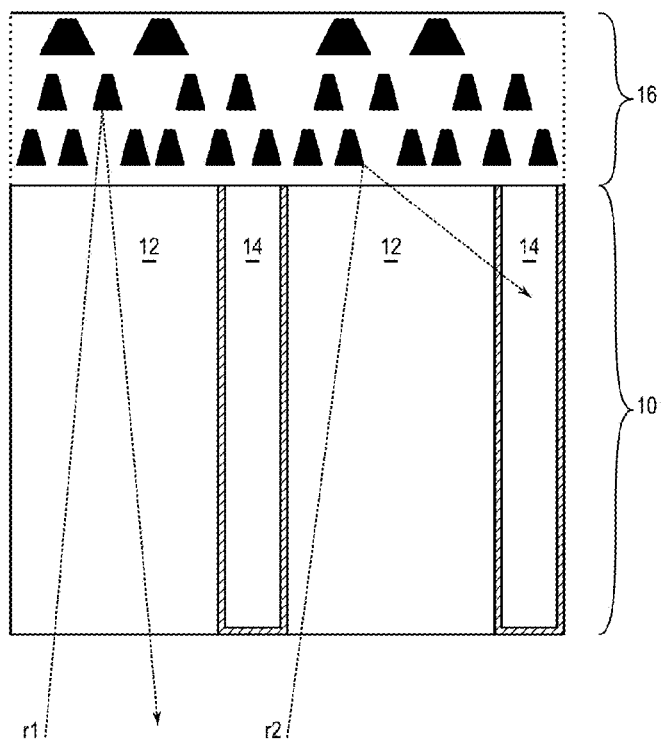
FIG. 1 is a simplified partial cross-sectional view of a back-side imager, illustrating photon paths.

FIG. 1 is a simplified cross-sectional view of two adjacent pixels of a back-side imager. The imager comprises an active layer 10, generally weakly boron-doped silicon, subdivided into a matrix of photosites 12. The photosites can be isolated from one another by deep trench isolators (DTI) 14.

The photosites form photodiodes with elements that are not explicitly represented. These photodiodes are controlled by transistors and a network of conductive tracks produced above the active layer 10 in an interconnect layer 16. This interconnect layer generally comprises a number of levels of metal connecting tracks. FIG. 1 represents three metal levels, by way of example.

If the imager is of the global shutter type, the trenches 14 can house capacitive memories, one for each photosite. These memories, accessible via the interconnect layer, are used to simultaneously store the charges accumulated in the photosites during a single integration interval, pending being read sequentially by a control circuit.

In fabrication, the elements of the imager are generally formed on a silicon substrate that can have a thickness of the order of 0.8 mm, according to traditional CMOS circuit fabrication techniques. The substrate is then thinned by its rear face to reach the active zone 10, that can have a thickness of the order of 5 µm.

The imager is designed to be lit by its rear face, that is to say by the bottom face of the active layer 10 in the figure.

A feature of a back-side imager is that the interconnect layer 16, given the density of the network of metal tracks that it includes, tends to reflect the photons which reach it, as is represented by rays r1 and r2. Thus, the photons which are not absorbed in passing through the active layer can re-emerge from the imager toward the captured object, as is represented by the ray r1. These photons generally have wavelengths in the infrared (above 700 nm).

In the case of a global shutter imager the reflected photons can also be returned to the capacitive memory contained in an adjacent trench 14, as is represented for the ray r2. The angle of incidence of the incoming photons relative to the walls of the trenches is such that the photons are mostly reflected by the walls. By contrast, the photons reflected by the irregular faces of the metal tracks can have angles of incidence that favor passing through the walls.

In certain applications, it is desirable for the imager to have a reflectance that is bounded, for example less than 5%, within a useful range of wavelengths. An absorption of more than 95% of the photons of wavelengths less than 850 nm can be obtained with a silicon thickness of more than 60 µm. Since, in the imager of FIG. 1, the reflected photons pass twice through the active layer 10, it would be necessary for the active layer to have a thickness greater than half of this value, 30 µm, which is difficult to consider in practice. The situation worsens if the wavelength of the photons is greater than 850 nm. The result thereof is that the back-side imagers are ill-suited to these applications.

The case of the ray r2 of FIG. 1, where the photon is absorbed in the capacitive memory 14, is also to be avoided, because the photon disrupts the charge stored in the memory, and therefore the accuracy of the measurement.

Figure 2:
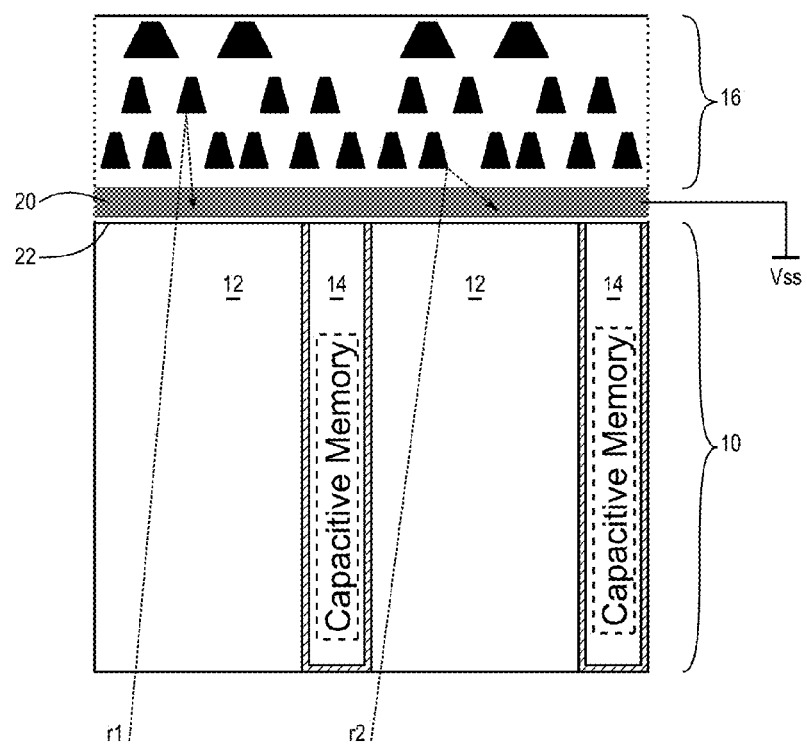
FIG. 2 is a simplified partial cross-sectional view of an embodiment of an imager having low reflectance.

In FIG. 2, to avoid these difficulties, an absorption layer 20 is inserted between the active layer 10 and the interconnect layer 16. The material of this layer 20 is preferably compatible with the imager fabrication methods and suitable for effectively absorbing the photons, notably in the infrared. Germanium is a good candidate. Germanium is a semiconductor which can be implemented by using the same technological processes as silicon and which, furthermore, exhibits excellent absorption characteristics.

To absorb 99% of the photons of wavelengths less than 850 nm, it is sufficient to have a germanium thickness of the order of 1.15 µm. With the reflected photons passing twice through the layer 20, it is sufficient for the layer 20 to have a thickness of the order of 0.6 µm. Depending on the ranges of wavelengths considered, the layer 20 can have a thickness of between 0.2 and 1 μm. With a thickness of 1 μm, the layer 20 can absorb more than 95% of the photons of 1000 nm wavelength.

The layer of germanium 20 can uniformly cover all of the matrix of pixels. Since germanium is semiconductive, it is preferable for the layer 20 not to be in electrical contact with the active layer 10. Thus, as is represented, a layer of silicon oxide 22 can be arranged between the layer of germanium 20 and the active layer 10.

The layer of germanium 20 can be amorphous and be produced by sputter deposition on the layer of oxide 22. The layer of oxide 22 can have a thickness of the order of 10 nm.

The photons absorbed by the layer of germanium 20 have a tendency to generate electrons which charge the layer 20. To discharge these charges, the layer 20 can be linked to a fixed potential, for example the low power supply potential Vss.

The invention claimed is:

1. A back-side imager, comprising:
    a matrix of photosites in an active layer;
    an interconnect layer covering the active layer;
    a layer of germanium positioned between the active layer and the interconnect layer; and
    trench isolators delimiting the photosites, the trench isolators including a capacitive memory for each photosite, accessible via the interconnect layer.

2. The imager according to claim 1, wherein the layer of germanium has a thickness of between 0.2 and 1 μm.

3. The imager according to claim 2, wherein the layer of germanium has a thickness of approximately 0.6 μm.

4. The imager according to claim 1, further comprising a layer of semiconductive oxide positioned between the active layer and the layer of germanium.

5. The imager according to claim 1, wherein the layer of germanium is biased to a reference potential.

6. An integrated circuit, comprising:
    an active layer of a silicon semiconductor material having a front surface and a back surface configured to receive light;
    a photosensitive region formed in the active layer;
    trench isolators delimiting the photosensitive region, wherein the trench isolators include a capacitive memory;
    a plurality of metal layers positioned adjacent to the front surface; and
    an absorption layer of a germanium semiconductor material positioned between the front surface and said plurality of metal layers configured to be connected to a reference supply voltage.

7. The integrated circuit of claim 6, further comprising a layer of an insulating material positioned between the front surface and said absorption layer.

8. The integrated circuit of claim 6, wherein the absorption layer has a thickness of between 0.2 and 1 μm.

9. The integrated circuit of claim 8, wherein the absorption layer has a thickness of approximately 0.6 μm.

* * * * *